United States Patent
Hébert et al.

(10) Patent No.: US 7,402,480 B2
(45) Date of Patent: Jul. 22, 2008

(54) METHOD OF FABRICATING A SEMICONDUCTOR DEVICE WITH MULTIPLE GATE OXIDE THICKNESSES

(75) Inventors: François Hébert, San Mateo, CA (US); Salman Ahsan, Fremont, CA (US)

(73) Assignee: Linear Technology Corporation, Milpitas, CA (US)

( * ) Notice: Subject to any disclaimer, the term of this patent is extended or adjusted under 35 U.S.C. 154(b) by 348 days.

(21) Appl. No.: 10/880,527

(22) Filed: Jul. 1, 2004

(65) Prior Publication Data
US 2006/0003511 A1    Jan. 5, 2006

(51) Int. Cl.
*H01L 21/8238* (2006.01)
(52) U.S. Cl. .................. 438/201; 438/275; 438/981
(58) Field of Classification Search .......... 438/199, 438/200, 201, 241, 258, 275, 981
See application file for complete search history.

(56) References Cited

U.S. PATENT DOCUMENTS

| | | | |
|---|---|---|---|
| 6,033,943 A | 3/2000 | Gardner | |
| 6,297,103 B1 | 10/2001 | Ahn et al. | |
| 6,475,862 B1 * | 11/2002 | Ando | 438/264 |
| 6,573,192 B1 | 6/2003 | Lee | |
| 6,661,061 B1 | 12/2003 | Gardner et al. | |
| 6,730,566 B2 * | 5/2004 | Niimi et al. | 438/275 |
| 2003/0067050 A1 * | 4/2003 | Kim | 257/501 |

OTHER PUBLICATIONS

Moazzami, Reza., et al. "A High-Quality Stacked Thermal/LPCVD Gate Oxide Technology for ULSI." IEEE Electron Device Letters, vol. 14, No. 2, Feb. 1993, pp. 72-73.

* cited by examiner

*Primary Examiner*—Zandra V. Smith
*Assistant Examiner*—Toniae M Thomas
(74) *Attorney, Agent, or Firm*—McDermott Will & Emery LLP

(57) ABSTRACT

The individual performance of various transistors is optimized by tailoring the thickness of the gate oxide layer to a particular operating voltage. Embodiments include forming transistors with different gate oxide thicknesses by initially depositing one or more gate oxide layers with intermediate etching to remove the deposited oxide from active regions wherein transistors with relatively thinner gate oxides are to be formed, and then implementing one or more thermal oxidation steps. Embodiments include forming semiconductor devices comprising transistors with two different gate oxide thicknesses by initially depositing an oxide film, selectively removing the deposited oxide film from active areas in which low voltage transistors having a relatively thin gate oxide are to be formed, and then implementing thermal oxidation.

21 Claims, 4 Drawing Sheets

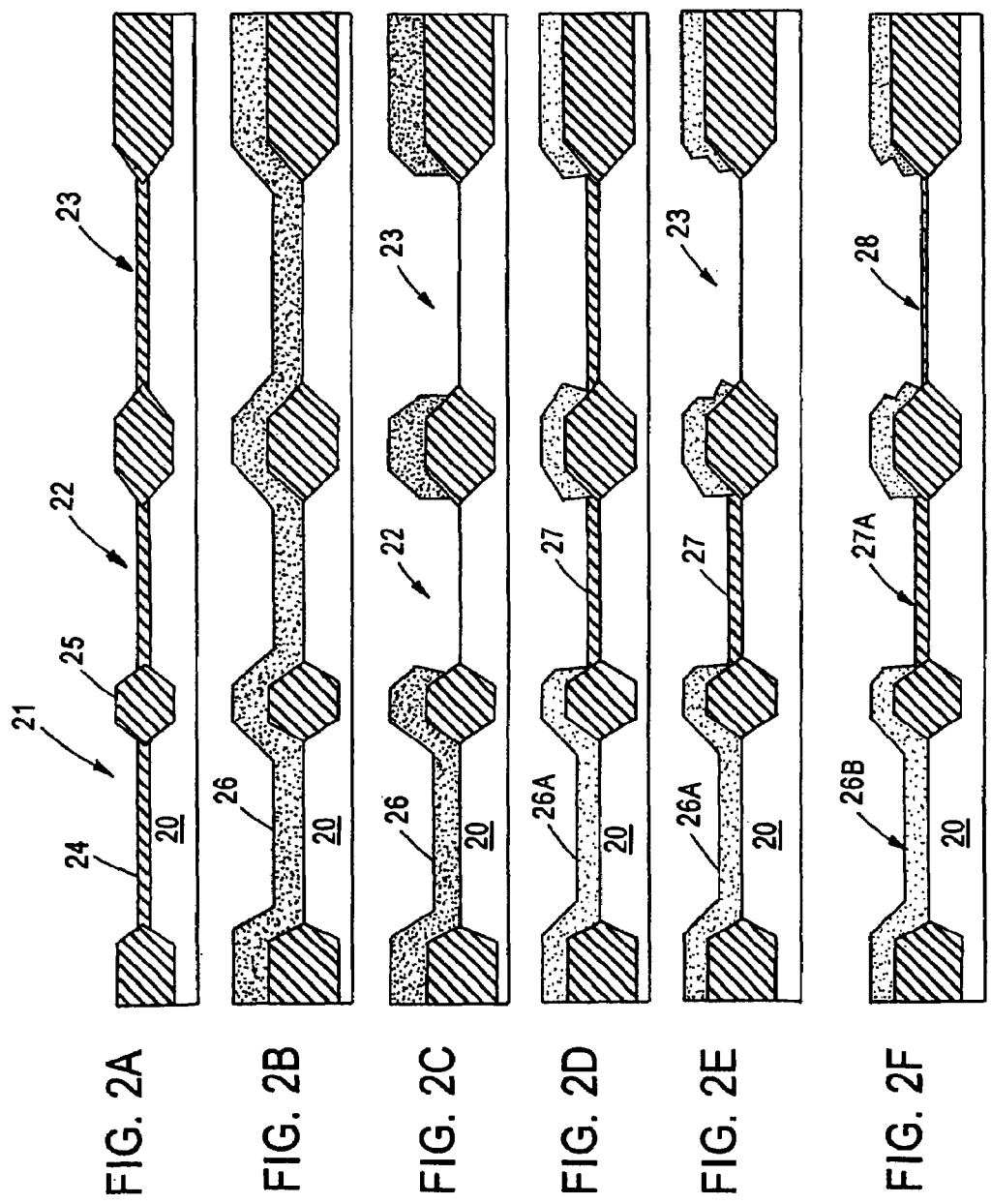

US 7,402,480 B2

METHOD OF FABRICATING A SEMICONDUCTOR DEVICE WITH MULTIPLE GATE OXIDE THICKNESSES

FIELD OF THE INVENTION

The present invention relates to Very Large Scale Integrated (VLSI) semiconductor devices comprising various transistors designed for different operating voltages. The present invention is particularly applicable in fabricating modularized semiconductor devices comprising transistors with gate oxides each having a thickness optimized for pre-designed transistor performance.

BACKGROUND OF THE INVENTION

The relentless pursuit of ever shrinking semiconductor devices continues to challenge the limitations of conventional semiconductor materials and fabrication techniques. Conventional semiconductor devices typically comprise a plurality of active devices in or on a common semiconductor substrate. The various transistors are designed for different operating voltages. Conventional practices, therefore, seek to provide transistors having different gate oxide thicknesses depending upon the performance of a particular transistor. Such different performance characteristics typically involve different operating voltages and, consequently, different gate oxide thickness. Typically, transistors operating at a high voltage require a relatively thick gate oxide layer; whereas, transistors designed for relatively lower operating voltages require a relatively thinner gate oxide layer.

Conventional methodology for fabricating semiconductor devices with transistors having different gate oxide thicknesses results in relatively poor quality thin gate oxide layers having defects. These defects cannot usually be removed by annealing and, hence, generate reliability problems, such as gate leakage or gate oxide breakdown. Such conventional methodology employed to fabricate transistors having different gate oxide thicknesses typically involves an excessive number of processing steps, adversely impacts impurity doping profiles with an attendant impact on operating voltage, requires modification of assembly line equipment and adversely impacts the critical gate oxide, i.e., the thin gate oxide for standard CMOS processes or the tunnel oxide for EEPROM processes. Such conventional practices include formation of a thin silicon nitride layer, nitrogen implantation and plasma exposure.

Accordingly, there exists a need for efficient methodology enabling the fabrication of semiconductor devices containing transistors having multiple gate oxide thicknesses with a low thermal budget, minimized dopant diffusion, negligible shift in the electrical parameters of existing transistors, wide flexibility as to the gate oxide thickness and without the need for specialized equipment or techniques, such as nitrogen implantation or plasma processes. There exists a particular need for such methodology enabling the fabrication of semiconductor devices containing various transistors with gate oxides having a thickness accurately tailored to different operating voltages.

DISCLOSURE OF THE INVENTION

An advantage of the present invention is a method of fabricating a semiconductor device comprising transistors with different gate oxide thicknesses.

Another advantage of the present invention is a method of fabricating a semiconductor device containing transistors with gate oxide thicknesses individually tailored to a particular operating voltage.

Additional advantages and other aspects and features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are obtained in part by a method of manufacturing a semiconductor device containing a plurality of transistors, the method comprising: forming insulation regions in a surface of a semiconductor substrate to isolate a plurality of active regions in which transistors are to be formed; depositing an oxide layer on the active regions, including first and second active regions, at a first thickness; selectively removing the deposited oxide layer from the second active region; and thermally oxidizing the substrate surface to form a thermal oxide layer at a second thickness, less than the first thickness, on the second active region.

Another advantage of the present invention is the method of manufacturing a semiconductor device containing a plurality of transistors with different gate oxide thicknesses on a substrate surface, the method comprising: depositing a first oxide layer on a plurality of active regions in which the transistors are to be formed; selectively removing the deposited first oxide layer from at least one active region leaving the first deposited oxide layer on a first active region; and thermally oxidizing the substrate surface to form a thermal oxide layer on the at least one active region.

Embodiments of the present invention include a dual gate oxide flow comprising initially depositing a gate oxide layer, as by low pressure chemical vapor deposition (LPCVD), on first and second active regions, selectively removing the deposited oxide from the second active region, and then implementing thermal oxidation to form a relatively thin thermal oxide layer on the second active region which is thinner than the deposited gate oxide layer.

Embodiments of the present invention include forming three or more gate oxides with different thicknesses by plural oxide depositions with intervening selective etching and/or plural thermal oxidations with intervening etching. A triple gate oxide flow in accordance with an embodiment of the present invention comprises depositing an initial gate oxide layer, as by LPCVD, as at a thickness of about 200 Å to about 2000 Å, selectively removing the deposited oxide from second and third active regions, leaving the deposited oxide on the first active region, conducting a first thermal oxidation to form a thermal oxide layer on the second and third active regions, as at a thickness of about 50 Å to about 200 Å, selectively removing the first thermal oxide from the third active region and then implementing the second thermal oxidation to form a second thermal oxide layer on the third active region. During thermal oxidation, impurities are driven out of the initially deposited oxide layer thereby densifying the deposited oxide layer with an attendant increase in thickness of up to about 10%. Another triple gate oxide flow in accordance with an embodiment of the present invention comprises plural oxide depositions. A first oxide layer is initially deposited over first, second and third active regions and then selectively removed from the second and third active regions. A second oxide layer is then deposited over the first, second and third active regions and selectively removed from the third active region. Thermal oxidation is then implemented to form a relatively thin thermal gate oxide in the third active region.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

FIGS. 2A-2F schematically illustrate sequential steps in accordance with a triple gate oxide flow in accordance with an embodiment of the present invention.

In FIGS. 1A-1E, FIGS. 2A-2F and FIGS. 3A-3G, similar features or elements are denoted by similar reference characters.

DESCRIPTION OF THE INVENTION

Figures 1A, 1B, 1C, 1D, 1E:
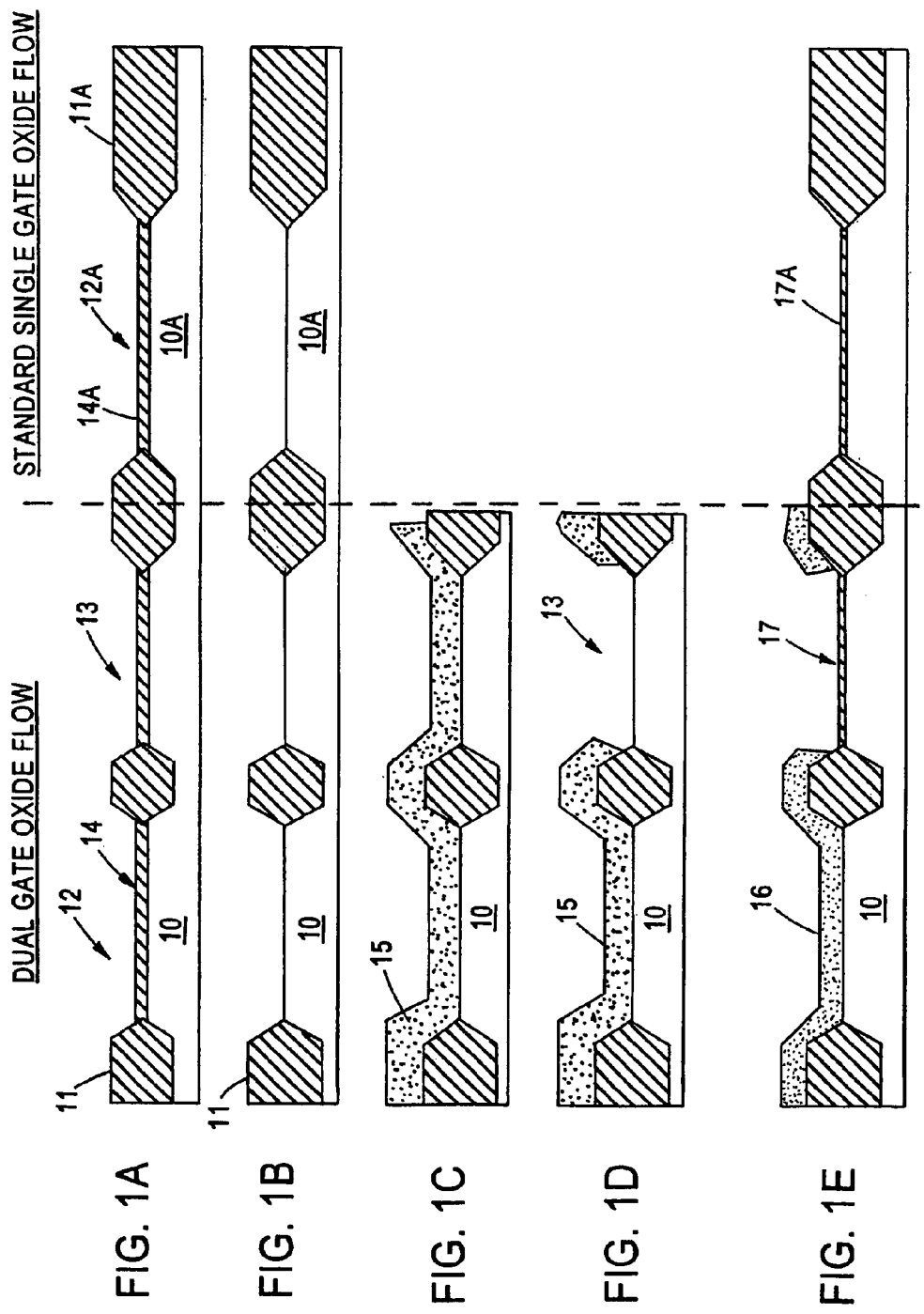
FIGS. 1A-1E schematically illustrate a dual gate oxide flow embodiment of the present invention vis-à-vis a standard single gate oxide flow.

The present invention addresses and solves limitations attendant upon conventional methodology in fabricating semiconductor devices containing multiple transistors having different gate oxide thicknesses dependent upon the performance requirements of the particular transistor. The present invention provides methodology enabling the fabrication of multiple gate oxide thicknesses, each tailored for a particular operating voltage. The present invention provides methodology enabling the fabrication any number of transistors having gate oxides with different thickness.

In accordance with embodiments of the present invention, multiple gate oxide thicknesses are integrated on a single wafer, wherein the thinner oxides are designed for transistors operating on a relatively low voltage; whereas, thicker oxides are utilized for transistors designed for higher voltage operation. Embodiments of the present invention include the fabrication of transistors with multiple gate oxides by initially depositing an oxide before implementing thermal oxidation to form a thermal oxide. Multiple oxide layers may be deposited and/or multiple thermal oxidations may be implemented with intervening densification annealing and etching to remove oxide from designated areas in which relatively thinner gate oxides are to be formed. Advantageously, in accordance with embodiments of the present invention, annealing and thermal oxidation facilitate the densification of the deposited oxide to set the targeted final thickness. During thermal oxidation, the density is increased such that it becomes equivalent to that of thermally grown oxide, and its thickness is increased by up to about 10%. Generally, the as-deposited oxide exhibits an index of refraction slightly higher than that of a thermal oxide. During subsequent densification annealing, the as-deposited index of refraction is typically reduced to slightly below that of a thermal oxide device and is then increased during thermal oxidation.

Any combination of single and multiple oxide depositions and single or multiple thermal oxidations may be employed to achieve multiple gate oxide thicknesses, thereby providing great flexibility as to the number of different gate oxide thicknesses as well as enlarging the window of gate oxide thicknesses and differences therebetween. Deposition of an oxide prior to thermal oxidation advantageously involves a low thermal budget, minimizes dopant diffusion and results in a negligible shift in the electrical parameters of the existing transistors. Embodiments of the present invention enable formation of gate oxide layers at any thickness. Advantageously, specialized equipment or techniques are not required, and process flow in accordance with embodiments of the present invention is compatible with existing single and dual gate oxide flows.

In accordance with embodiments of the present invention, the initially deposited oxide may be deposited by any of various conventional deposition techniques, including various forms of chemical vapor deposition (CVD), such as LPCVD, plasma enhanced chemical vapor deposition (PECVD) and subatmospheric chemical vapor deposition (SACVD). Deposition may be implemented at temperatures of about 300° C. up to about 950° C. For example, silicon oxide can be deposited employing dichlorosilane and oxygen at a temperature range of about 650° to about 950°. During deposition it is desirable to control the flow of the reactants in order to reduce the deposition rate, thereby improving the quality of the deposited oxide layer. Thermal oxidation may be implemented in an oxygen containing ambient, such as oxygen diluted with nitrogen, or in steam, typically at a temperature of about 800° C. to about 1100° C.

The present invention is not limited to forming any particular number of gate oxides having different thicknesses, but encompasses multiple gate oxides having a variety of different thicknesses. The number of gate oxides and range of their thicknesses can be strategically designed by implementing one or more oxide depositions and/or one or more thermal oxidations under controlled conditions. A dual gate oxide flow in accordance with an embodiment of the present invention is schematically illustrated in FIGS. 1A-1E appearing at the left hand side vis-à-vis a standard single gate oxide flow appearing at the right hand side. Adverting to FIG. 1A, isolation regions 11, which may be conventional field oxide regions or shallow trench isolation regions, are formed in substrate 10 isolating first and second active regions 12 and 13, respectively, and a sacrificial oxide 14 formed therein. In accordance with standard single gate oxide flow, a sacrificial oxide 14A is formed in active region 12A on substrate 10A isolated by insulating region 11A. As schematically illustrated in FIG. 1B, the sacrificial oxide layer 14, 14A, is removed from the active regions in the dual gate oxide flow of an embodiment in accordance with the present invention as in the standard single gate oxide flow.

In accordance with the illustrated embodiment of the present invention, an oxide layer 15, such as silicon oxide, is deposited in the first and second active regions 12, 13, respectively, as by LPCVD. Oxide layer 15 is then selectively removed from the second active region 13, as by employing a conventional photolithographic and etching technique, e.g., hydrofluoric acid solution, resulting in the intermediate structure shown in FIG. 1D. Deposited oxide 15 is typically formed at a thickness of about 200 Å to about 2000 Å. Subsequently, as illustrated in FIG. 1E, thermal oxidation is implemented resulting in the formation of thermal oxide layer 17, as at a thickness of about 50 Å to about 600 Å, but less than the thickness of the deposited oxide film 15. During such thermal oxidation, the thickness of the originally deposited oxide film 15 increases by up to 10%, enabling accurate tailoring of the final thickness of both oxide layer 16 and oxide layer 17 by controlling the degree of thermal oxidation. On the right hand side, in accordance with a standard single gate oxide flow, a single thermal oxide layer 17A would be formed.

Subsequently, as in conventional practices, transistors are formed in first and second active regions 12, 13, as by depositing a gate electrode layer, implementing conventional photolithographic and etching techniques, and forming source/drain regions, which conventional steps are not illustrated for illustrative convenience. A transistor formed in the first active region 12 would be used at a high operating voltage up to about 40 volts, while a transistor formed in the second active region 13 would be used at a lower operating voltage of up to about 5.5 volts. In alternative embodiments, thermal oxide 17 may be grown at a thickness up to about 600 Å and, hence, used for transistors designed for intermediate operating voltages up to about 13.6 to about 15 volts.

Embodiments of the present invention are not confined to a dual gate oxide flow, but may be used to form any number of gate oxides with different thicknesses for different transistor performance requirements. A triple gate oxide flow embodiment of the present invention may be implemented using a single gate oxide deposition and multiple thermal oxidations, as schematically illustrated in FIGS. 2A-2F. Adverting to FIG. 2A, first active region 21, second active region 22 and third active region 23 are formed in substrate 20 defined by isolation regions 25. A sacrificial oxide 24 is formed in the first, second and third active regions and then removed, consistent with conventional practices. Oxide layer 26 is then deposited, as by LPCVD, at a thickness of about 200 Å to about 2000 Å, e.g., at about 850 Å, as illustrated in FIG. 2B. The deposited oxide layer is then subjected to densification annealing. For example, the deposited oxide may be annealed at a temperature of about 1,000° C. for about 30 minutes in a dry oxygen ambient or in a dry nitrogen ambient. Typically, annealing in a dry oxygen ambient increases the thickness of the deposited oxide. During such densification annealing in dry oxygen, the thickness of the initially deposited oxide layer 26 increases significantly, as by about 200 Å-250 Å, which is equivalent to an increase of about 29%. However, during annealing in a dry nitrogen ambient, the initially deposited oxide shrinks slightly. The use of a dry oxygen or nitrogen ambient during densification annealing facilitates tailoring the final thickness of the first gate oxide layer.

Deposited oxide 26, which will ultimately be the first or very thick gate oxide, is then patterned by etching to remove it from the second active region 22 and third active region 23 where moderately thick and thin gate oxides are required, respectively, as by conventional photolithographic (resist masking) and etching techniques, leaving the densified deposited oxide 26 in first active region 21 designated for a transistor requiring a relatively high operating voltage.

The resist mask employed during patterning is then stripped in a conventional manner, as with hot sulfuric acid. Precleaning is then implemented, during which about 50 Å of thermal oxide is removed.

Subsequently, as illustrated in FIG. 2D, a first thermal oxide layer 27 is then grown, as at a thickness which may range from 50 Å to about 600 Å, e.g., about 480 Å, as by heating at a temperature of about 1,000° C. in a dry oxygen ambient in the presence of chlorine. During such thermal oxidation, deposited oxide 26 increases in density, and its thickness increases up to about 10%.

Subsequently, as illustrated in FIG. 2E, thermal oxide 27 is patterned by etching to selectively remove it from the third active region 23 where a thin gate oxide is required, employing conventional photolithographic (resist masking) and etching techniques. The resist mask employed during patterning is then removed in a conventional manner, as by employing hot sulfuric acid, followed by precleaning which removes about 50 Å of the thermal oxide.

A second thermal oxidation is then implemented to form a second thermal oxide layer 28 in the third active region 23, as schematically illustrated in FIG. 2F. Second thermal oxide layer 28 is formed at a thickness of about 50 Å to about 300 Å, e.g., 140 Å, as by heating in dry oxygen at a temperature of about 920° C. During such thermal oxidation, the thickness of the first thermal oxide 27 increases, the increased thickness thermal oxide film designated by reference character 27A. In addition, the gate oxide in active region 21 is further increased in thickness resulting in the gate oxide designated by reference character 26B. First, second and third transistors are then formed in the first 21, second 22 and third 23 active regions, respectively, employing conventional methodology which is not illustrated for convenience. Gate oxide 26B typically has a thickness of from about 200 Å to about 2000 Å, e.g., 1350 Å, and a transistor formed thereon is designed for high voltage operation typically up to about 40 volts. Gate oxide 27A typically has an intermediate thickness of about 300 Å to about 1000 Å, e.g., 500 Å, and a transistor formed thereon is designed for an intermediate operating voltage typically up to about 15 volts. Thermal gate oxide layer 28 may have a thickness of about 50 Å to about 300 Å, e.g., 140 Å, and a transistor formed thereon is suitable for most analog processing involving a relatively low operating voltage typically of about 3 volts to about 6 volts, e.g., about 5 volts.

Densification annealing subsequent to deposition of the oxide layer may be effected in dry oxygen or in dry nitrogen. Experimental results indicate that densification annealing in a dry oxygen ambient increases the measured thickness of the initially deposited oxide by about 200 to about 250 Å, thereby facilitating achieving a final targeted thickness of 1350 Å +/−100 Å which is ideally suited for 40 volt applications. Experimental results also indicate that when densification annealing is implemented in dry nitrogen, the deposited oxide film appears to be reduced in thickness by about 50 Å, or about 4%. Accordingly, when densifying in a dry nitrogen ambient, embodiments of the present invention comprise depositing the initial oxide layer at a greater thickness, as at about 1150 Å, thereby facilitating achieving the targeted thickness of 1350 Å for 40 volt applications.

A grown silicon oxide layer typically exhibits greater integrity than most deposited oxide films, generally having demonstrated higher uniformity, less defects and high dielectric strength than deposited oxide films. The index of refraction of a thermal oxide film is typically 1.462. Experimental results indicate that the as-deposited oxide typically exhibits an index of refraction slightly greater than that of a thermal oxide. For example, in depositing an oxide layer having a thickness of about 1200 Å, the index of refraction is about 1.461 to 1.475. During densification annealing in dry oxygen, as at about 1,000° C., the index of refraction generally decreases to about 1.444 to 1.463, while densification annealing in dry nitrogen, as at a temperature of about 1,000° C., generally reduces the index of refraction to about 1.447 to 1.459. However, during thermal oxidation, the index of refraction of the deposited oxide typically increases to about 1.463 to 1.468, indicative of a high integrity thick gate oxide layer.

Figure 3A:
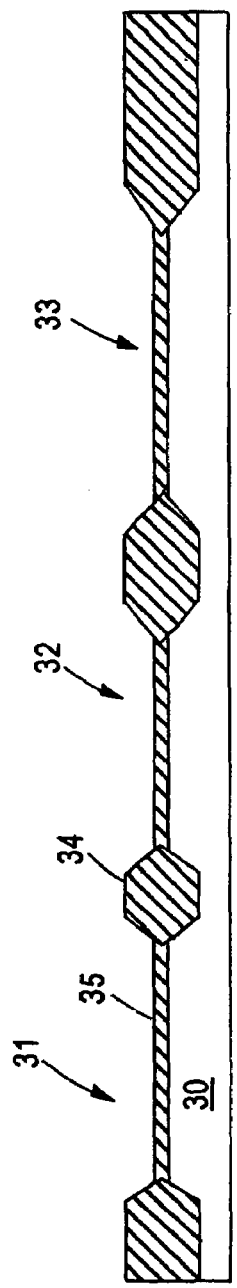
FIGS. 3A-3G schematically illustrate sequential phases of a triple gate oxide flow in accordance with another embodiment of the present invention.
Figure 3B:
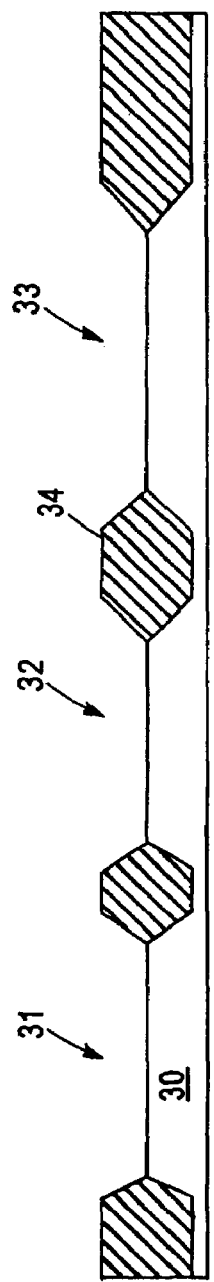
Figure 3C:
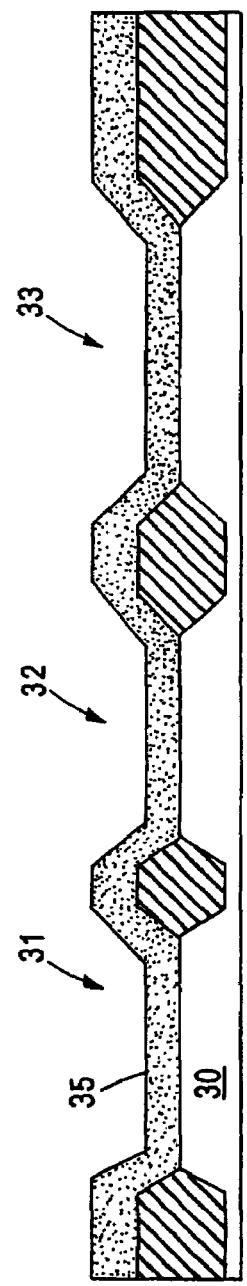

Another embodiment of the present invention schematically illustrated in FIGS. 3A-3G involves a triple gate oxide flow with multiple deposited oxides. Adverting to FIG. 3A, first, second and third active regions 31, 32 and 33, respectively, are formed in semiconductor substrate 30 and are defined by insulating isolation regions 34. A sacrificial oxide 35 is grown thereon and subsequently removed, as shown in FIG. 3B, consistent with conventional methodology. A first gate oxide layer 35 is deposited over first, second and third active regions 31, 32, 33, as by LPCVD, as at a thickness of about 200 Å to about 1000 Å, as illustrated in FIG. 3C. Densification annealing is then implemented, as in dry oxygen or dry nitrogen.

Figure 3D:
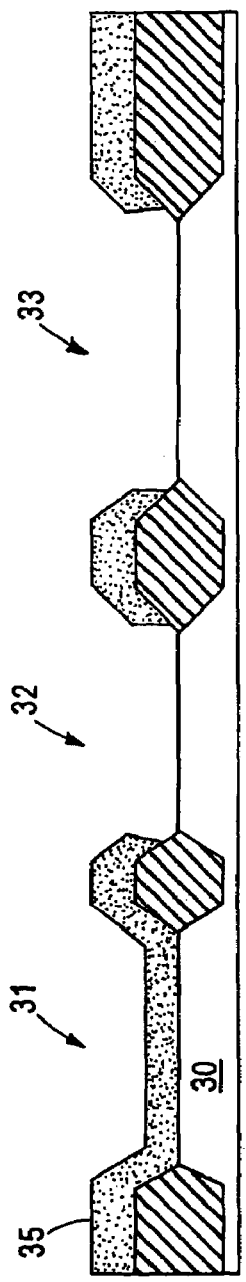

First deposited gate oxide layer 35 is then patterned by etching to remove it from the second active region 32 and third active region 33, employing conventional photolithographic (resist masking) and etching techniques, leaving the first deposited gate oxide layer 35 in the first active region 31, as illustrated in FIG. 3D. Resist stripping, as with hot sulfuric acid, followed by precleaning are then implemented.

Figure 3E:
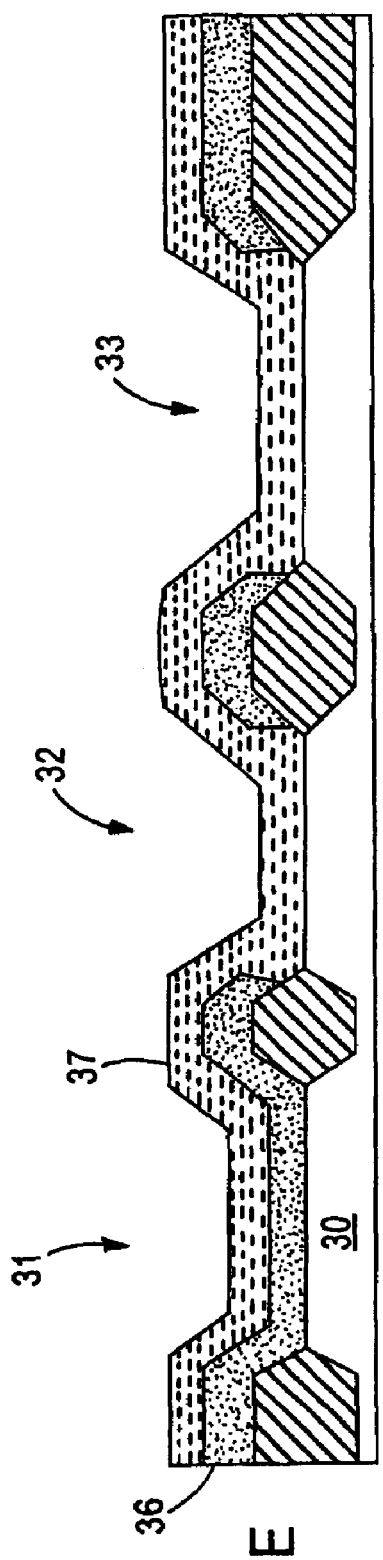

Subsequently, a second gate oxide layer 37 is deposited over the first deposited oxide layer 36 in the first active region 31 and over the second and third active regions 32 and 33, respectively, as illustrated in FIG. 3E. Second deposited oxide layer 37 many also be deposited at a thickness of about 200 Å to about 1000 Å. Densification annealing is then implemented in dry oxygen or dry nitrogen. Embodiments of the present invention include densification annealing after depositing each of the first and second oxide layers, or conducting a single densification annealing after both the first and second oxide layers have been deposited.

Figure 3F:
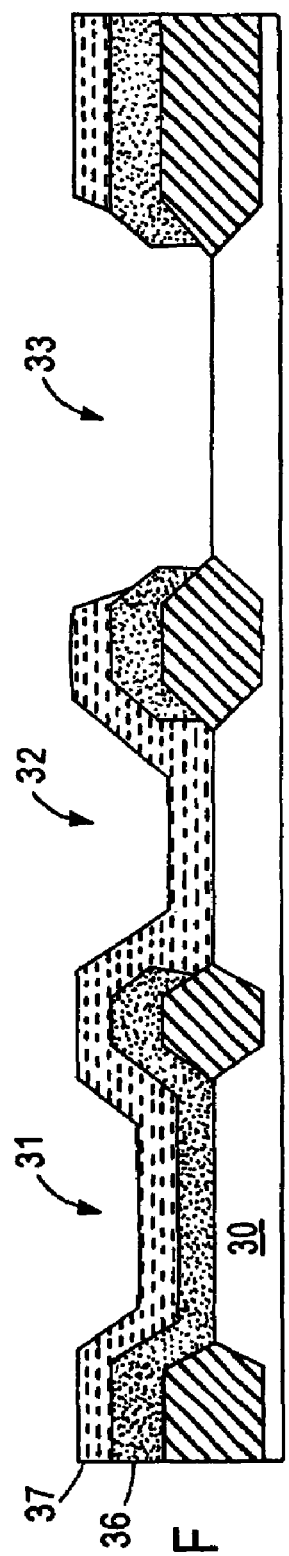
Figure 3G:
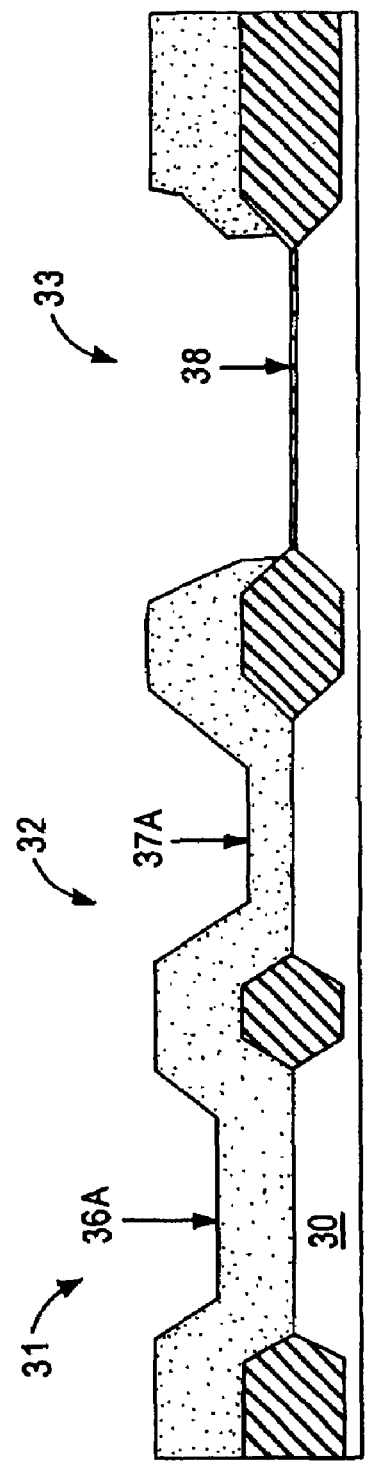

Subsequently, as is schematically illustrated in FIG. 3F, the second deposited oxide 37 is patterned by etching to remove it from the third active region 33, as by conventional photolithographic (resist masking) and etching. The resist mask is then removed, as by employing hot sulfuric acid, followed by precleaning.

At this point, the total gate oxide thickness in the first active region 31 is the sum of the first and second densified deposited oxide layers 36 and 37, while the thickness of the gate oxide layer in the second active region 32 is equivalent to the thickness of the second densified deposited oxide layer 37. Thermal oxidation is then implemented to form a thermal oxide layer 38, as at a thickness of about 50 Å up to about 600 Å, in the third active region 33. During such thermal oxidation, the gate oxides in the first active region 31 and second active region 32 are further densified and increased in thickness resulting in the gate oxide layer 36A in the first active region 31 and gate oxide layer 37A in the second active region 32. Subsequently, as in the previously illustrated embodiment, first, second and third transistors are formed over gate oxide layers 36A, 37A and 38, respectively, in first, second and third active regions 31, 32, and 33, respectively. The transistor formed in first active region 31 is designed for a high operating voltage typically up to about 40 volts having a thickness up to about 2000 Å, e.g., about 1350 Å. The second transistor formed in second active region 32, with a gate oxide layer 37A at a thickness of about 300 Å to about 1000 Å, e.g., 500 Å, is designed for an intermediate operating voltage typically up to about 15 volts. The third transistor formed in third active region 33, typically having a gate oxide thickness of about 50 Å to about 300 Å, e.g., 140 Å, is designed for analog use requiring a low operating voltage typically up to about 5 volts.

Embodiments of the present invention also include forming transistors wherein the threshold voltage can be less than 1 volt. Such inventive embodiments comprise tailoring doping in the active region with respect to the various gate oxide thicknesses employed.

The present invention provides methodology enabling the fabrication of numerous different transistors with a wide range of gate oxide thicknesses tailored for individual transistor performance. Advantageously, the thickness of each gate oxide layer can be fine tuned by controlling deposition parameters and oxidation conditions. The present invention advantageously enables the fabrication of transistors with multiple gate oxide thicknesses employing efficient methodology with a minimum number of processing steps while minimizing dopant diffusion and minimizing degradation of the critical oxide. The present invention is applicable to the fabrication of any of various types of semiconductor devices, such as various CMOS, BiCMOS, and EPROM devices. Embodiments of the present invention can be practiced utilizing conventional techniques and instrumentalities at rates consistent with the throughput requirements of automated fabrication techniques and is fully compatible with conventional process flow for the manufacture of high-density integrated semiconductor devices.

The present invention enjoys industrial applicability in fabricating various types of semiconductor devices. The present invention enjoys particular industrial applicability in fabricating miniaturized semiconductor devices containing numerous transistors with different gate oxide thicknesses tailored for particular performance.

In the previous description, numerous specific details are set forth, such as specific materials, structures, reactants, processes, etc., in order to provide a better understanding of the present invention. However, the present invention can be practiced without resorting to the details specifically set forth. In other instances, will-known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of fabricating a semiconductor device containing a plurality of transistors, the method comprising:
    forming insulation regions in a surface of a semiconductor substrate to isolate a plurality of active regions in which transistors are to be formed;
    depositing an oxide layer on the active regions, including first and second active regions, at a first thickness;
    selectively removing the deposited oxide layer from the second active region; and
    thermally oxidizing the substrate to form a thermal oxide layer at a second thickness, less than the first thickness, on the second active region, and to increase the first thickness of the deposited oxide layer on the first active region to a third thickness.

2. The method according to claim 1, comprising:
    depositing the oxide layer by chemical vapor deposition at a temperature between 300° C. and 950° C.; and
    thermally oxidizing the substrate in an oxygen-containing atmosphere at a temperature of 800° C. to 1100° C.

3. The method according to claim 1, comprising depositing the oxide layer at a first thickness of about 200 Å to about 2000 Å; and
    forming the thermal oxide at a second thickness of about 50 Å to about 600 Å.

4. The method according to claim 1, comprising thermally oxidizing the substrate to increase the first thickness of the deposited oxide layer by up to about 10% to the third thickness.

5. The method according to claim 1, comprising:
forming a first transistor having the deposited oxide layer at the third thickness in the first active region; and
forming a second transistor comprising the thermal oxide layer at the second thickness in the second active region; wherein:
the first transistor is designed for a first operating voltage of up to 40 volts;
the second transistor is designed for a second operating voltage, less than the first operating voltage, of up to 15 volts.

6. The method according to claim 5, wherein each of the first and second transistors has a threshold voltage of less than 1 volt.

7. A method of fabricating a semiconductor device containing a plurality of transistors, the method comprising:
forming insulation regions in a surface of a semiconductor substrate to isolate a plurality of active regions in which transistors are to be formed;
depositing an oxide layer on first, second and third active regions;
selectively removing the deposited oxide layer from the second and third active regions;
thermally oxidizing the substrate to form a first thermal oxide layer, at a second thickness less than the first thickness, on the second and third active regions;
selectively removing the first thermal oxide layer from the third active region; and
thermally oxidizing the substrate surface to form a second thermal oxide layer, at a third thickness, less than the first thickness, on the third active region.

8. The method according to claim 7, comprising:
thermally oxidizing the substrate to form the first thermal oxide layer and to increase the first thickness of the deposited oxide layer in the first active region to a fourth thickness; and
thermally oxidizing the substrate surface to form the second thermal oxide layer, increase the fourth thickness of the deposited oxide layer in the first active region to a fifth thickness and to increase the second thickness of the first thermal oxide layer in the second active region to a sixth thickness less than the fifth thickness.

9. The method according to claim 8, wherein:
the fifth thickness is about 1000 Å to about 2000 Å;
the sixth thickness is about 300 Å to about 600 Å; and
the fourth thickness is about 50 Å to about 200 Å.

10. The method according to claim 8, comprising:
forming a first transistor comprising the deposited oxide layer at the fifth thickness in the first active region;
forming a second transistor comprising the first thermal oxide layer at the sixth thickness in the second active region; and
forming a third transistor comprising the second thermal oxide layer at the third thickness in the third active region; wherein:
the first transistor is designed for a first operating voltage of up to 40 volts;
the second transistor is designed for a second operating voltage, less than the first operating voltage, of up to 15 volts; and
the third transistor is designed for a third operating voltage, less than the second operating voltage, of up to 5 volts.

11. A semiconductor device produced by the method according to claim 10.

12. The method according to claim 10, wherein:
each of the first, second and third transistors has a threshold voltage of less than 1 volt.

13. The method according to claim 7, comprising densification annealing the deposited oxide layer in dry oxygen or in dry nitrogen before selectively removing the deposited oxide layer from the second and third active regions.

14. A method of manufacturing a semiconductor device containing a plurality of transistors with different gate oxide thicknesses on a substrate surface, the method comprising:
depositing a first oxide layer on a plurality of active regions in which the transistors are to be formed;
selectively removing the deposited first oxide layer from at least one active region leaving the first deposited oxide layer on a first active region;
thermally oxidizing the substrate to form a thermal oxide layer on the at least one active region;
depositing a second oxide layer on the first deposited oxide layer in the first active region, on a second active region and on the at least one active region after selectively removing the deposited first oxide layer and before thermally oxidizing to form the thermal oxide layer; and
selectively removing the deposited second oxide layer from the at least one active region, leaving the deposited second oxide layer on the deposited first oxide layer and on the second active region before thermally oxidizing to form the thermal oxide layer.

15. The method according to claim 14, comprising:
depositing the first and second oxide layers at a thickness of about 200 Å to about 2000 Å; and
forming the thermal oxide layer at a thickness of about 50 Å to about 200 Å.

16. The method according to claim 15, comprising:
forming a first transistor in the first active region designed for a first operating voltage of up to 40 volts;
forming a second transistor in the second active region designed for a second operating voltage, less than the first operating voltage, of up to 15 volts; and
forming a third transistor in the at least one active region designed for a third operating voltage, less than the second operating voltage, of up to 5 volts.

17. The method according to claim 16, wherein each of the first, second and third transistors has a threshold voltage of less than 1 volt.

18. The method according to claim 14, comprising densification annealing the first and second oxide layers in dry oxygen or in dry nitrogen before selectively removing the deposited second oxide layer from the at least one active region.

19. A semiconductor device produced by the method according to claim 14.

20. A method of manufacturing a semiconductor device containing a plurality of transistors with different gate oxide thicknesses on a substrate surface, the method comprising:
depositing a first oxide layer on a plurality of active regions in which the transistors are to be formed;
selectively removing the deposited first oxide layer from at least one active region leaving the first deposited oxide layer on a first active region;
thermally oxidizing the substrate to form a thermal oxide layer on the at least one active region;
depositing at least one additional oxide layer, after selectively removing the deposited first oxide layer, and before thermally oxidizing the surface; and selectively removing the at least one additional oxide layer from the at least one active region before thermally oxidizing.

21. A method of manufacturing a semiconductor device containing a plurality of transistors with different gate oxide thicknesses on a substrate surface, the method comprising:

depositing a first oxide layer on a plurality of active regions in which the transistors are to be formed;

selectively removing the deposited first oxide layer from at least one active region leaving the first deposited oxide layer on a first active region;

thermally oxidizing the substrate to form a thermal oxide layer on the at least one active region;

selectively removing the thermal oxide layer from other active regions leaving the thermal oxide layer on the at least one active region; and thermally oxidizing the substrate to form another thermal oxide layer on the thermal oxide layer on the at least one active region and on the other active regions.

* * * * *